United States Patent
Rhodes

(10) Patent No.: US 7,344,910 B2
(45) Date of Patent: Mar. 18, 2008

(54) SELF-ALIGNED PHOTODIODE FOR CMOS IMAGE SENSOR AND METHOD OF MAKING

(75) Inventor: Howard E. Rhodes, Boise, ID (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 36 days.

(21) Appl. No.: 11/235,823

(22) Filed: Sep. 27, 2005

(65) Prior Publication Data

US 2007/0072325 A1     Mar. 29, 2007

(51) Int. Cl.
*H01L 21/00* (2006.01)
(52) U.S. Cl. .............. 438/57; 438/78; 257/E21.362
(58) Field of Classification Search .............. 438/78, 438/79, 57
See application file for complete search history.

(56) References Cited

U.S. PATENT DOCUMENTS

| 6,040,593 | A | * | 3/2000 | Park | 257/292 |
| 6,894,268 | B2 | * | 5/2005 | Ohkawa | 250/214.1 |
| 7,183,129 | B2 | * | 2/2007 | Lee | 438/48 |
| 2003/0234432 | A1 | * | 12/2003 | Song et al. | 257/440 |

* cited by examiner

*Primary Examiner*—W. David Coleman
(74) *Attorney, Agent, or Firm*—Blakely Sokoloff Taylor & Zafman LLP

(57) ABSTRACT

A method for forming a photodiode that is self-aligned to a transfer gate while being compatible with a metal silicide process is disclosed. The method comprises forming a gate stack of gate oxide, polysilicon, and a sacrificial/disposable cap insulator over the polysilicon. The insulator may be a combination of silicon oxynitride and silicon dioxide. After formation of the photodiode, the cap insulator layer is removed.

15 Claims, 6 Drawing Sheets

SELF-ALIGNED PHOTODIODE FOR CMOS IMAGE SENSOR AND METHOD OF MAKING

TECHNICAL FIELD

The present invention relates to image sensors, and more particularly, to an image sensor that uses pixels having photodiodes self-aligned to the transfer gate.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption and cost have encouraged the further miniaturization and integration of the image sensor. Possibly as a result of the greater miniaturization and integration of the image sensor, various issues for both CMOS image sensors have arisen. For example, it is often difficult to maintain uniformity of performance across the millions of pixels in an image sensor pixel array.

Currently, the most popular type of CMOS pixel structure is the four transistor active pixel. FIG. 1 shows a cross-sectional view of a prior art active pixel that uses four transistors. This is known in the art as a 4T active pixel. A photodiode 101, outputs a signal that is used to modulate an amplification transistor 103. The amplification transistor 103 is also referred to as a source follower transistor. In this embodiment, the photodiode 101 can be either a pinned photodiode or a partially pinned photodiode. The photodiode 101 comprises a N− layer 115 that is a buried implant. Additionally, in one embodiment, a shallow P+ pinning layer 116 is formed at the surface of the semiconductor substrate 102.

Further, various structures are formed atop of and into the silicon substrate 102. For example, the photodiode 101 and the floating node 107 are formed into the silicon substrate 102. These structures are said to be formed below the surface of the silicon substrate by the use of dopants. Similarly, field oxides or shallow trench isolation structures are also formed at and below the top surface (or simply surface) of the silicon substrate. Other structures, such as the gate oxide 108, the transfer gate 106, the transfer transistor 105, and the reset transistor 113 are formed atop of the silicon substrate 102 and are said to be at or above the top surface of the silicon substrate.

A transfer transistor 105 is used to transfer the signal output by the photodiode 101 to floating node 107 (N+ doped), which is adjacent to the gate of the transfer transistor 105 and opposite the photodiode 101. The transfer transistor 105 is controlled by a transfer gate 106. The transfer transistor 105 also has a gate oxide 108 underneath the transfer gate 106.

In operation, during an integration period (also referred to as an exposure or accumulation period), the photodiode 101 stores charge that is held in the N− layer 115. After the integration period, the transfer transistor 105 is turned on to transfer the charge held in the N− layer 115 of the photodiode 101 to the floating node 107. After the signal has been transferred to the floating node 107, the transfer transistor 105 is turned off again for the start of a subsequent integration period. The signal on the floating node 107 is then used to modulate the amplification transistor 103.

In the prior art, the photodiode 101 and its implants 115 and 116 are typically not self-aligned to the adjacent transfer gate. Thus, the surface P+ implant 116 and the buried N− implant 115 oftentimes may or may not be aligned with the transfer gate 106. In the prior art, both of these implants are performed prior to the formation of the transfer gate 106. For example, turning to FIG. 2, after the active areas and shallow trench isolations (STI) are formed, a photoresist is patterned over the gate oxide layer. The photoresist has an opening that allows for the formation of the surface P+ implant 116. The P-type implant, typically boron, is then implanted in the opening forming the surface P+ implant layer 116. The resist is then stripped.

Next, in FIG. 3, new photoresist layer is patterned. An N-type implant, such as phosphorous, is implanted in the opening forming the buried N− implant layer 115. Note that the lateral offset between the P+ layer 116 and the N− layer 115 varies due to alignment registration errors at both of these patterning steps. Next, a gate oxide and a transistor gate stack are formed on the wafer. A spacer layer is deposited and etched back using an anisotropic etch and the source/drain regions are implanted as shown in FIG. 1.

The overlap of the N− implant under the adjacent transfer gate and the underlap of the P+ implant 116 to the transfer gate are controlled by alignment registration of the P+ implant reticle, the N− implant reticle, and the transistor gate reticle. This introduces a variability in both the performance of the transfer gate and for charge transfer from the photodiode to the floating node 107.

Further, using conventional steps, the N channel and P channel lightly doped drain (LDD) implants are performed. The LDD implants are masked implants with resist covering the photodiode region so that the photodiode is not implanted. Sidewall spacers are formed such that the N+ and P+ source/drains can be implanted as seen in FIG. 1.

Next, turning to FIG. 4, in the prior art, in a salicide process, a protective insulator is deposited typically with a thickness of 100-1,000 Å of oxide. The protective insulator is removed from the gate stack using either a resist etch back process or a chemical-mechanical polishing (CMP) process. The result after the removal step is seen in FIG. 5. Next, in FIG. 6, a photoresist layer is formed which protects the photodiode. A metal such as cobalt or titanium is then deposited onto the wafer to a thickness of between 50-300 Å. A heat treatment is performed to allow the silicon in contact with the metal to react to form a metal silicide. Finally, the wafer is wet dipped into a bath that removes the unreacted metal and the result is seen in FIG. 7. Remaining process steps to complete the imager include dielectric deposition, contact etching, metal and via formation, passivation, bond pad etching, color filter arrays formation, and microlens formation.

As seen above, the prior art process may result in inconsistent lateral offsets between the photodiode and the transfer gates due to alignment issues.

DETAILED DESCRIPTION

Figure 1:
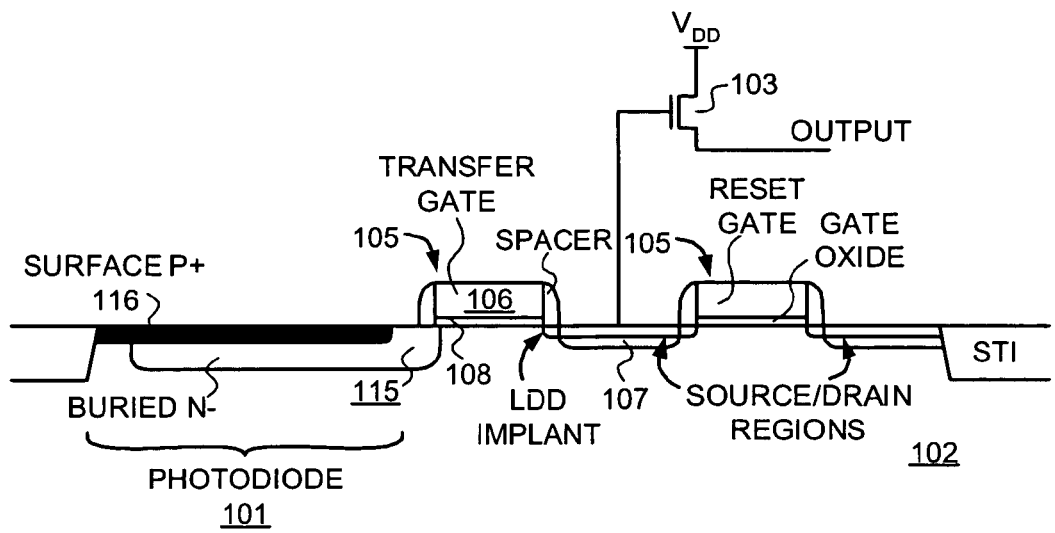
FIG. 1 is a cross-sectional view of a prior art four transistor (4T) pixel which shows in detail a photodiode formed in a substrate.
Figure 2:
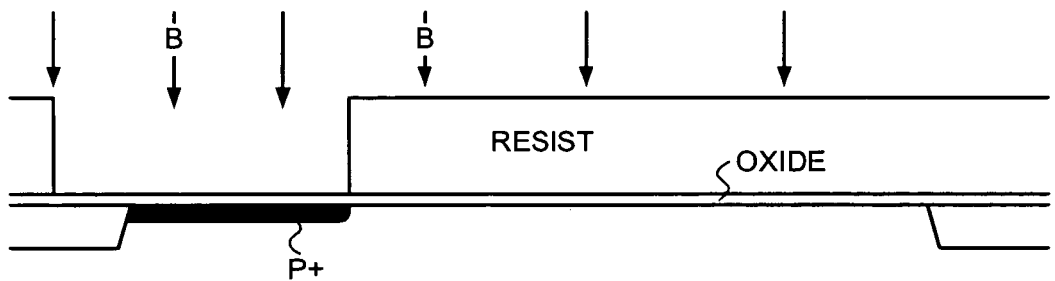
FIGS. 2-7 are cross-sectional views of a prior art process for forming a photodiode and pixel of FIG. 1.
Figure 3:
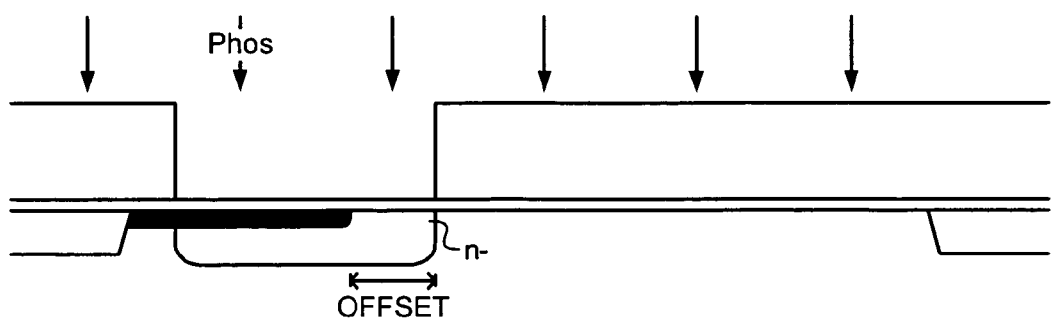
Figure 4:
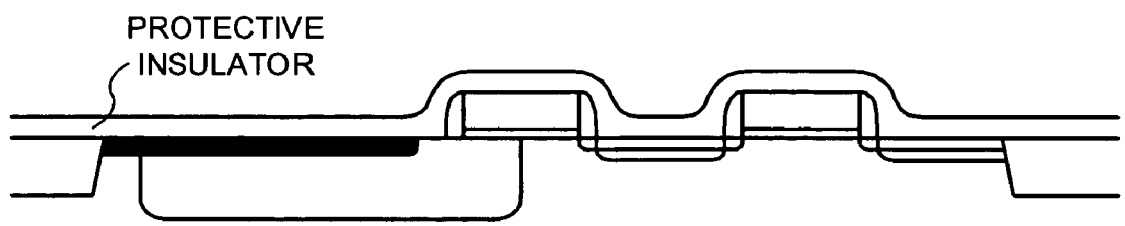
Figure 5:
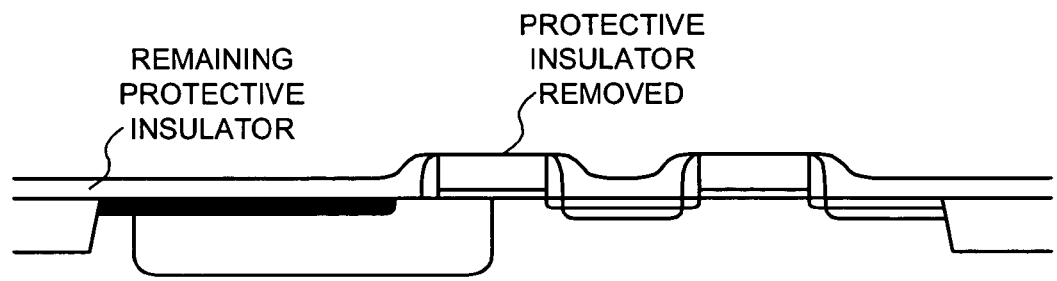
Figure 6:
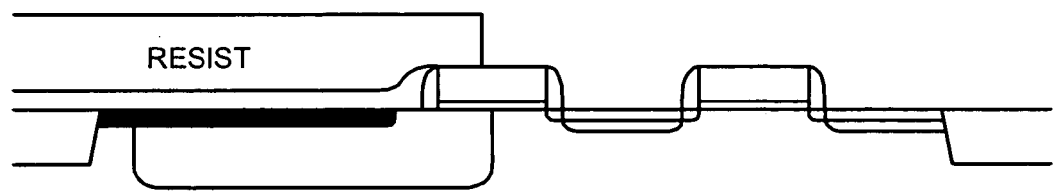
Figure 7:
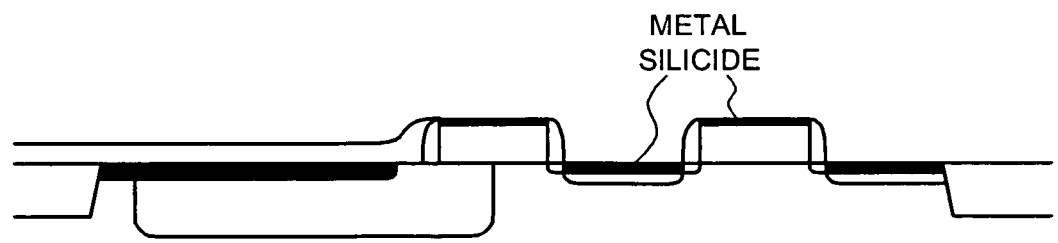

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

References throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments. For example, the photodiode design and process of the present invention can be used with any type of pixel design, including but not limited to 3T, 4T, 5T, 6T, 7T, and other designs.

The present invention is a pixel for an image sensor that has the photodiode self-aligned with the transfer gate. Further, the self-aligned process is consistent with the other required elements of the manufacturing process flow. For example, many image sensors use a manufacturing process that use a metal salicide process to improve the speed of periphery transistors and to provide a low resistance routing line. However, the photodiode sensor region should be protected from this salicide process. If the photodiode were to be silicided, the performance of the pixel would be degraded since a cobalt silicide or a titanium silicide is opaque to light and wood block light to the underlying photodiode. The silicide would also increase dark current at the photodiode. For these reasons, as described above, a protective coating such as oxide is placed over the photodiode and over a substantial portion of the imaging array to protect a sensitive region from the silicide process.

Moreover, the salicide formation process should be placed in the process flow after the spacer etch and after all the implant steps are completed. This is because the implant steps require high temperatures to activate the dopants and without a spacer in place there may be shorts between the source/drain regions and the transistor gate during the salicide formation. As one example, my co-pending application entitled "Salicide Process for Image Sensors" filed Feb. 14, 2005 and accorded U.S. patent application Ser. No. 11/058, 117 provides a good exposition on the salicide process, which is herein incorporated by reference.

For an image sensor process that uses a salicide process and that wishes to combine a self-aligned photodiode process, one issue is that the salicide process requires that the photodiode region be protected by a protective layer, such as an oxide. This oxide deposited over the photodiode and the transfer gate prevents any subsequent implant from being aligned to the transfer gate edge.

One method of forming a self-aligned pinned photodiode is to use a very thick polysilicon deposition as part of the transistor gate formation. However, this increases the stack height of the imager and degrades performance. The polysilicon also has grains that are aligned in different crystallographic directions. The high energy buried N− implant can channel through appropriately oriented grains and result in unwanted variations in transistor gate performance.

Figure 8:
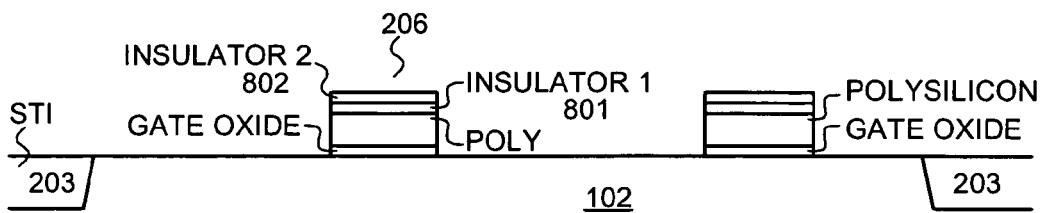
FIGS. 8-16 are cross-sectional views of a process for forming a self-aligned photodiode in accordance with one embodiment of the present invention.

The present invention will now be described in connection with FIGS. 8-16. Turning to FIG. 8, a semiconductor substrate 102 is shown. In one embodiment, the semiconductor substrate 102 is a silicon substrate. A standard isolation 203, such as a shallow trench isolation (STI) defines an active area within the semiconductor substrate 102. In one embodiment, the STI is lined with a P-type field implant. The isolation 203 is used to electrically isolate an active area that will contain a pixel.

Still referring to FIG. 8, a transistor gate stack is deposited by the deposition or growth of a relatively thin gate oxide layer using conventional semiconductor processing methods, such as thermal growth or chemical vapor deposition. Next, a conductive layer, such as a polysilicon layer, is deposited over the gate oxide layer. In one embodiment, the gate oxide layer is typically 15-100 Å thick and the polysilicon layer is typically between 500 and 2500 Å thick, and more preferably between 1500-2000 Å. The polysilicon layer (when patterned, etched, and possibly doped) will serve as the gate of the various transistors such as the transfer transistor 105 or the reset transistor 113.

Further, a first insulator layer 801 and a second insulator layer 802 are deposited over the polysilicon layer. The first and second insulator layers 801 and 802 are also referred to as sacrificial, cap, or disposable insulator layers. As seen below, the disposable insulator may be a metal oxide, silicon oxide, silicon oxynitride, silicon nitride, or combination thereof They may also serve as an antireflection coating that improves patterning resolution at the transistor gate photolithography step. The first and second insulator layers 801 and 802 is later removed at an appropriately defined stage in the process to allow the subsequent reaction of a metal deposited onto the polysilicon to form the metal silicide.

In one embodiment, the first insulator layer 801 is a silicon oxynitride of thickness between 400-1200 Å, and in one embodiment between 600-1000 Å. The second insulator layer 802 is a deposited silicon oxide layer having a thickness of between 50-400 Å and in one embodiment between 100-200 Å. The use of these materials provides an excellent sacrificial layer that provides good patterning capability for the transistor gate stack 206.

Alternatively, the disposable insulator layers may be a single nitride or a single silicon oxynitride layer. In such a case, as part of the transistor gate patterning, an organic bottom antireflective coating (ARC) layer can be deposited just prior to the photoresist coating to help better define the transistor gates. After patterning, the ARC layer is etched and then the transistor gate stack is etched in the manner described above. The remaining ARC and photoresist is stripped after the transistor gate has been formed. The cap silicon oxynitride or cap nitride layers can later be removed after the N− implant for the photodiode. The removal may be done using a wet hot phosphoric acid etch. After removal of these layers, the stack is patterned and etched to leave the gate stack structures shown in FIG. 8. These two structures will eventually form the transfer gate 206 and the gate of the reset transistor 113.

Figure 9:
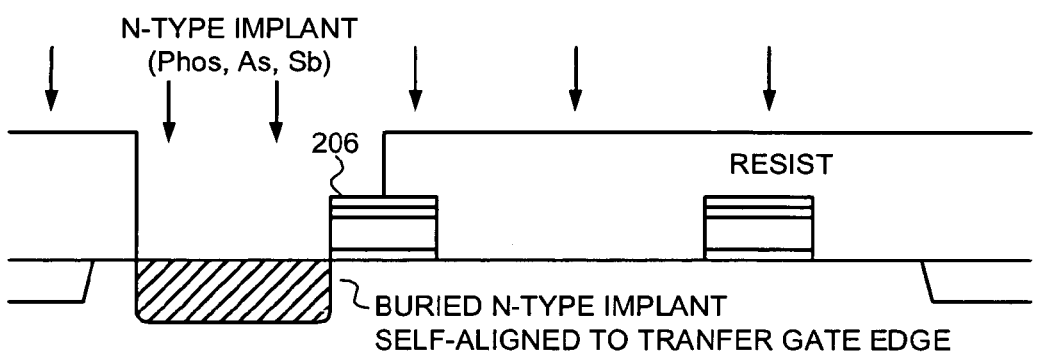

Next, turning to FIG. 9, a photoresist layer is deposited and patterned to provide an opening for the photodiode formation. After the transistor gate stack 206 has been patterned, the total thickness of the polysilicon, the first insulator layer 801, and the second insulator layer 802 should be thick enough to block the N− buried implant. With a polysilicon thickness of 1800 Å, a silicon oxynitride thickness of 850 Å, and a silicon dioxide thickness of 150 Å, an arsenic implant energy of 180 kev or a phosphorous implant energy of 90 kev can be effectively blocked. The dosage for the N− implant is typically between 1e12 to 7e12 ions/cm². The result is that the N− implant is buried beneath the surface and is self-aligned to the adjacent transfer gate edge. Note that although this description discusses the implantation of a photodiode N− implant next to a transfer gate edge, the teachings of the present invention may be used with any self-aligned implants adjacent to, for example, a reset gate, a high dynamic range gate, lateral overflow drain gate, or other adjacent gate structure.

Figure 10:
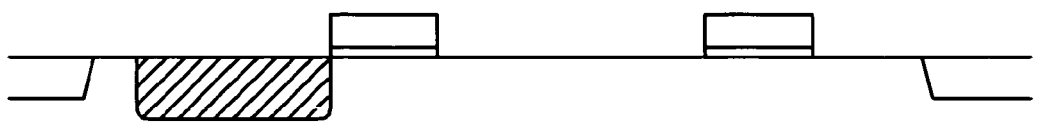

After the N− implant, the photoresist is removed, as well as the first insulator layer 801 and the second insulator layer 802. The second insulator layer 802 can be first removed using a dry or wet oxide etch. For example, a wet HF dip which has excellent selectivity to the first insulator layer may be used. The first insulator layer is then removed using a dry or wet silicon oxynitride etch. For example, it may be a wet phosphoric etch to minimize any reduction to the remaining gate oxide or the silicon surface. At this point, as seen in FIG. 10, the surface of the polysilicon layer does not have any remaining insulator.

Figure 11:
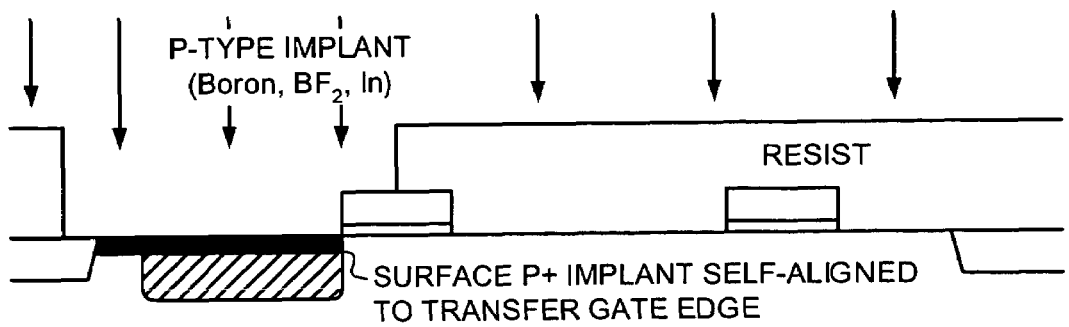

Next, turning to FIG. 11, another photoresist layer is formed with an opening for the P+ pinning layer. The P+ implant dose, in one embodiment is 7e12-1e14, and preferably 1e13-5e13 ions/cm². The implant species may be B11, BF2, or indium. If the implant is B11, the implant energy is 15 kev or less. If the implant species is BF2, the implant energy is on the order of 10-40 kev.

Note that alternatively, the removal of the first and second insulator layers 801 and 802 may be done after the P+ implant instead of after the buried N− implant.

Figure 12:
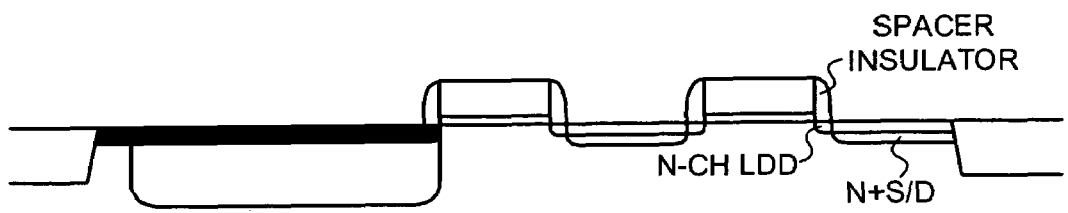
Figure 13:
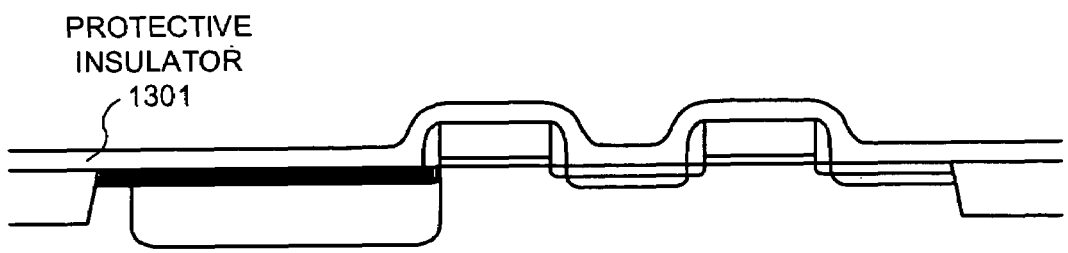
Figure 14:
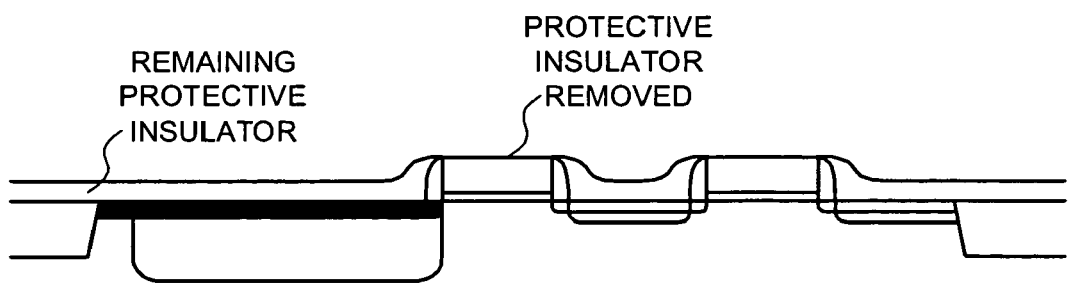
Figure 15:
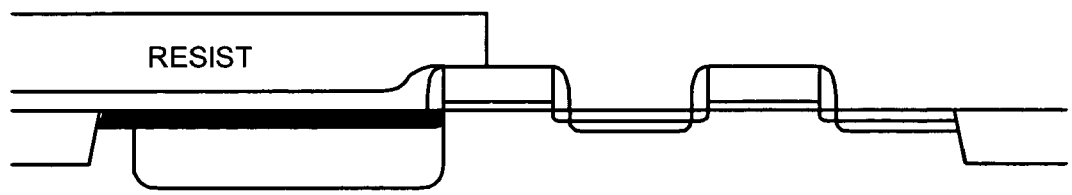

Next, turning to FIGS. 12-14, processing can now be used to form the salicide on the new self-aligned photodiode. The N channel and P channel LDD implants are performed first. Next, a spacer insulator is deposited and an anisotropic spacer etch forms sidewall spacers on both the transfer gate and the reset gate as seen in FIG. 12. The spacers are then used to act as a mask for the N+ and P+ source/drains regions outside of the photodiode.

Figure 16:
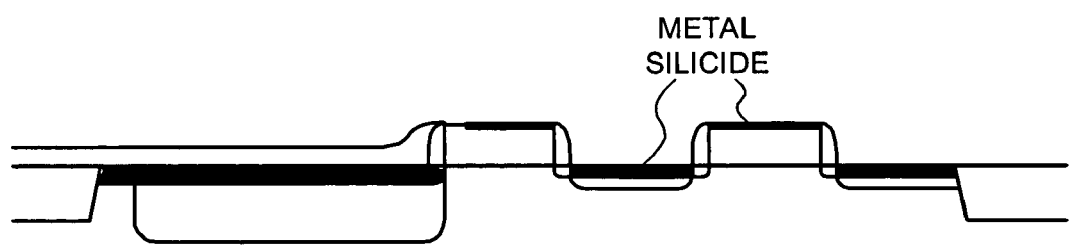

Continuing, in FIG. 13, a protective insulator 1301 is formed over the top of the structure of FIG. 12. The protective insulator is selectively removed from the gate stack using either a resist etch back process or a CMP process to provide the resulting structure of FIG. 14. A resist mask is used in FIG. 15 to remove portions of the protective insulator and oxide over the floating node and other regions. A metal such as cobalt or titanium is then deposited onto the wafer and a heat treatment is applied to allow the silicon in contact with the metal to react to form the metal silicide. The wafer is then dipped in a wet bath that removes the unreacted metal over the oxide regions and not the formed silicide. The result is seen in FIG. 16. Thus, as described above, the present invention achieves a self-aligned photodiode process in combination with a metal silicide process.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of forming a portion of an active pixel comprising:
    forming a gate stack on a semiconductor substrate, said gate stack comprising a gate oxide layer, a polysilicon layer, and a disposable insulator atop of said polysilicon layer;
    etching said gate stack to form an adjacent gate stack having said disposable insulator atop said polysilicon layer and absent from a side of said adjacent gate stack;
    after the formation of said gate stack, masking said active pixel to expose a photodiode region adjacent to said adjacent gate stack;
    forming a photodiode in said photodiode region by implanting said photodiode region with n-type and p-type dopants using said adjacent gate stack as a self-aligned mask; and
    removing said disposable insulator atop of said adjacent gate stack.

2. The method of claim 1 wherein said disposable insulator layer comprises a silicon oxynitride layer having a thickness between 400-1200 Å and a silicon dioxide layer having a thickness of between 50-400 Å.

3. The method of claim 1 wherein said disposable insulator layer is a silicon oxynitride layer.

4. The method of claim 1 wherein said disposable insulator layer is a silicon dioxide layer.

5. The method of claim 1 further comprising:
    forming sidewall spacers on the adjacent gate stack;
    forming a protective insulator layer over said active pixel;
    removing portions of said protective insulator layer over select portions of said active pixel including at least a portion of said adjacent gate stack to expose said polysilicon or said semiconductor substrate; and
    forming a metal silicide on said exposed polysilicon or said semiconductor substrate.

6. The method of claim 1 wherein the etching of said adjacent gate stack also forms a reset gate stack, said disposable layer also removed from said reset gate stack after the formation of said photodiode.

7. The method of claim 1 wherein said adjacent gate stack is a transfer gate stack, reset gate stack, high dynamic range gate stack, or lateral overflow drain gate stack.

8. The method of 1 wherein said disposable insulator is a metal oxide, silicon oxide, silicon oxynitride, silicon nitride, or combination thereof.

9. The method of claim 1 wherein said polysilicon layer is between 500-2500 angstroms thick.

10. The method of claim 1 wherein said active pixel is a 3T, 4T, 5T, 6T, or 7T pixel design.

11. The method of claim 5 wherein said metal silicide is a cobalt silicide or a titanium silicide.

12. The method of claim 5, wherein said metal silicide comprises a cobalt silicide.

13. The method of claim 6 further comprising:
    forming sidewall spacers on the adjacent gate stack and said reset gate stack;
    forming a protective insulator layer over said active pixel;
    removing portions of said protective insulator layer over select portions of said active pixel including at least a portion of said transfer gate stack and a portion of said reset gate stack to expose said polysilicon or said semiconductor substrate; and
    forming a metal silicide on said exposed polysilicon or said semiconductor substrate.

14. The method of claim 13 wherein said metal silicide is a cobalt silicide or a titanium silicide.

15. The method of claim 9 wherein said polysilicon layer is between 1500-2300 angstroms thick.

* * * * *